United States Patent [19]

Albrecht

[11] Patent Number: 5,286,301
[45] Date of Patent: Feb. 15, 1994

[54] CHEMICAL VAPOR DEPOSITION SYSTEM CLEANER

[75] Inventor: John W. Albrecht, Bozeman, Mont.

[73] Assignee: C.V.D. System Cleaners Corporation, Bozeman, Mont.

[21] Appl. No.: 862,139

[22] Filed: Apr. 2, 1992

Related U.S. Application Data

[60] Division of Ser. No. 574,155, Aug. 29, 1990, Pat. No. 5,109,562, which is a continuation-in-part of Ser. No. 400,920, Aug. 30, 1989, abandoned.

[51] Int. Cl.$^5$ .............................................. B08B 9/08
[52] U.S. Cl. ........................................ 134/8; 134/10; 134/22.11; 134/22.12; 134/19; 134/1; 134/34; 134/21; 134/166 R; 134/166 C; 15/56
[58] Field of Search ............... 134/8, 10, 21, 22.11, 134/22.12, 19, 34, 166 R, 166 C, 167 R, 167 C, 1; 15/56, 104.05, 104.16, 104.1 C, 345, 363, 383, 395, 104.2

[56] References Cited

U.S. PATENT DOCUMENTS

| | | | |
|---|---|---|---|
| 1,869,730 | 8/1932 | Antle | 15/314 |
| 3,774,262 | 11/1973 | Anthony et al. | 15/345 |
| 3,946,459 | 3/1976 | Armstrong | 15/395 |
| 4,266,316 | 5/1981 | Schneider et al. | 15/304 |
| 4,426,566 | 1/1984 | Coughlin et al. | 219/136 |
| 4,473,921 | 10/1984 | Weber et al. | 15/395 |
| 4,486,238 | 12/1984 | Bando | 134/8 |
| 4,500,492 | 2/1985 | Yamakawa | 134/37 |
| 4,543,684 | 10/1985 | Bandoh et al. | 15/309 |
| 4,720,889 | 1/1988 | Grave | 15/322 |
| 4,792,363 | 12/1988 | Franklin, Jr. et al. | 134/8 |
| 4,976,002 | 12/1990 | Leonov et al. | 15/304 |

FOREIGN PATENT DOCUMENTS

| | | | |
|---|---|---|---|
| 171241 | 12/1986 | European Pat. Off. | |
| 1062393 | 3/1967 | United Kingdom | 15/395 |

OTHER PUBLICATIONS

Cheung, S. D., et al, "Monitor Particles in Real Time to Sleuth Contamination Sources", *Semiconductor International*, Oct. 1988, pp. 98–102.

Gill, P., and Dillenbeck, K. "Using Snake Patterns to Monitor Defects and Enhance VLSI Device Yields", *Microcontamination*, Mar. 1989, pp. 33–36, 60.

*Primary Examiner*—Mark L. Bell
*Assistant Examiner*—Zeinab El-Arini
*Attorney, Agent, or Firm*—Lowe, Price, LeBlanc & Becker

[57] ABSTRACT

An apparatus for cleaning the interior surfaces of a vessel which includes a cleaning head supported and guided into the vessel by a rigid air shaft. The cleaning head is supplied with a process fluid and directs and removes the process fluid from a cleaning zone located on the interior surface of the vessel. The process fluid is heated by a heat exchanger hose assembly that is connected to the air shaft. The apparatus utilizes turbulent fluid flow, thermal shock, ultrasonic vibration and/or piezoelectric vibration to dislodge particulates from the inner surfaces of the vessel. The apparatus is useful for cleaning chemical vapor deposition reactors and other similar vessels.

9 Claims, 4 Drawing Sheets

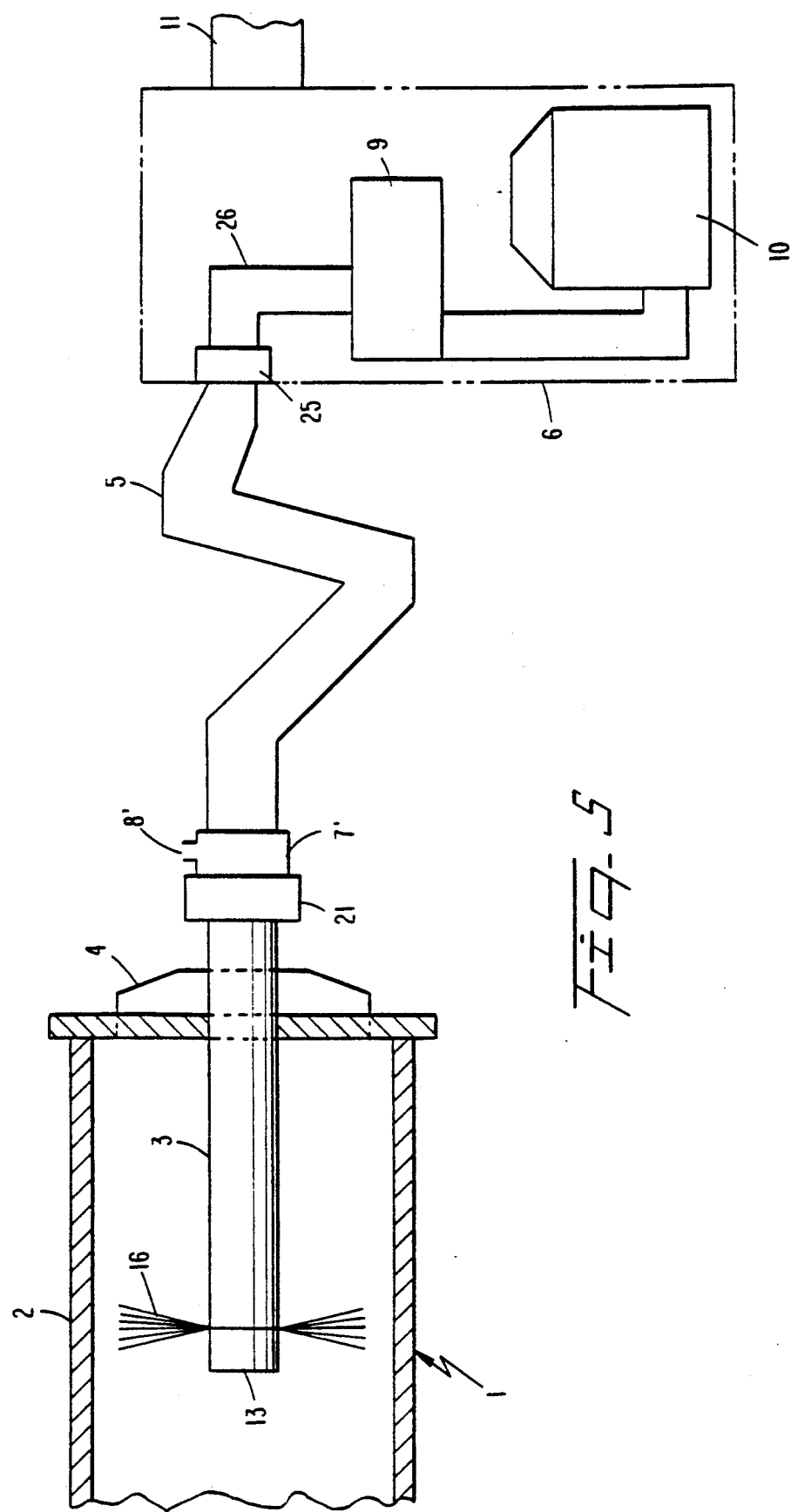

CHEMICAL VAPOR DEPOSITION SYSTEM CLEANER

This application is a divisional application of application Ser. No. 07/574,155, filed Aug. 29, 1990, now U.S. Pat. No. 5,109,562, which is a continuation-in-part application of application Ser. No. 07/400,920, filed Aug. 30, 1989, now abandoned.

TECHNICAL FIELD

This invention relates to methods and apparatus for cleaning the interior surfaces of a chemical reactor and more particularly relates to methods and apparatus for cleaning the interior surfaces of a chemical vapor deposition reactor.

BACKGROUND ART

Surface contamination has become a major focus of research in the semiconductor manufacturing industry. The effects caused by different sources of surface contamination are responsible for most of the yield loss currently experienced. Particulate contamination has been identified as one of the prime contributors to yield loss in advanced integrated circuit (IC) fabrication.

The production process used to fabricate most integrated circuits uses chemical vapor deposition (CVD) several times, in order to produce certain layers required for proper functioning of the circuit. During CVD, different gases are burned inside a furnace, and their combustion product (a glass in vapor form) is condensed onto the surface of the wafer as well as on to other surfaces within the furnace reactor. When the process is complete and the wafers are withdrawn from the reactor, the thermal shock caused by the cooler air in the reactor furnace causes glass frost (vapox) formed on the inside surfaces of the reaction furnace to crack and become loose.

The loosened vapox particles drop onto the surfaces of the wafers subsequently processed as a source of particulate contaminants causing significant reductions in final product yield. 50 to 70% of the failures of integrated circuits are believed to be caused by contamination. Many these failures are believed to be caused from contamination by these CVD particulates. Because of this, furnaces are ideally cleaned after each critical process step and as often as possible for less critical processes.

A typical cleaning requires shutting down the furnace, removing all the gas lines, sensors, and heaters, removing the furnace liner from inside the furnace, soaking and scrubbing the liner with hydrofluoric acid, repairing the damage caused by the acid, replacing the liner in the furnace, connecting all gas lines, sensors and heaters, testing and recalibrating the furnace. A complete furnace cleaning can take from 12 to 72 hours and must be done by highly trained technical personnel. Furnaces being cleaned are not processing products, causing interruptions and disturbing the product flow throughout the facility.

While technology has focused on and advanced in the area of integrated circuit manufacturing processes there remains a need in the industry for a convenient, efficient and economical method for cleaning chemical vapor deposition reactors. Such a method would advantageously decrease the yield loss currently experienced and would be highly desirable and accepted by the industry.

DISCLOSURE OF THE INVENTION

It is accordingly one object of the present invention to provide an apparatus for cleaning the interior surfaces of a reactor.

It is another object of the present invention to provide an apparatus for cleaning the interior surfaces of a chemical vapor deposition reactor furnace which does not require expensive dismantling of the reactor furnace nor a long term shut down of the chemical vapor deposition process.

It is a further object of the present invention to provide an apparatus for cleaning the interior surfaces of a reactor which includes novel means to dislodge and remove particulates from the inner surfaces of the reactor.

A still further object of the present invention is to provide a method for cleaning the interior surfaces of a reactor by which particulates formed on the interior surfaces of the reactor are dislodged and removed in a time efficient manner.

An even still further object of the present invention is to provide a method for cleaning the interior surfaces of a chemical vapor deposition reactor furnace in which particulates formed on the interior surfaces of the reactor are dislodged by novel mechanical means and removed by supplying and removing process fluids to and from the reactor.

According to the present invention there is provided an apparatus for cleaning the interior surfaces of a reactor which includes a cleaning head which is supported by an air shaft. The cleaning head is designed to enter the interior of the reactor and direct processing fluids to cleaning zones defined by the cleaning head. The cleaning head further includes means to produce mechanical dislodging forces to particulates formed on the interior surfaces of the reactor. The processing fluid entrains particulates removed from the interior surfaces of the reactor and is exhausted through the cleaning head. Heat is exchanged between the process fluid entering and leaving the reactor by means of both rigid and flexible heat exchanger hose assemblies so as to control thermal shock during the cleaning operation.

The present invention further provides for a method of cleaning the interior surfaces of a reactor which utilizes a novel apparatus described above.

BRIEF DESCRIPTION OF DRAWINGS

The present invention will now be described with reference to the annexed drawings, which are given by way of non-limiting examples only in which:

FIG. 5 ia a schematic cross-sectional view illustrating an alternative embodiment of the present invention wherein process fluid is fed into the system at a location between the air shaft and the heat exchanger hose assembly.

BEST MODE FOR CARRYING OUT THE INVENTION

Figure 1:
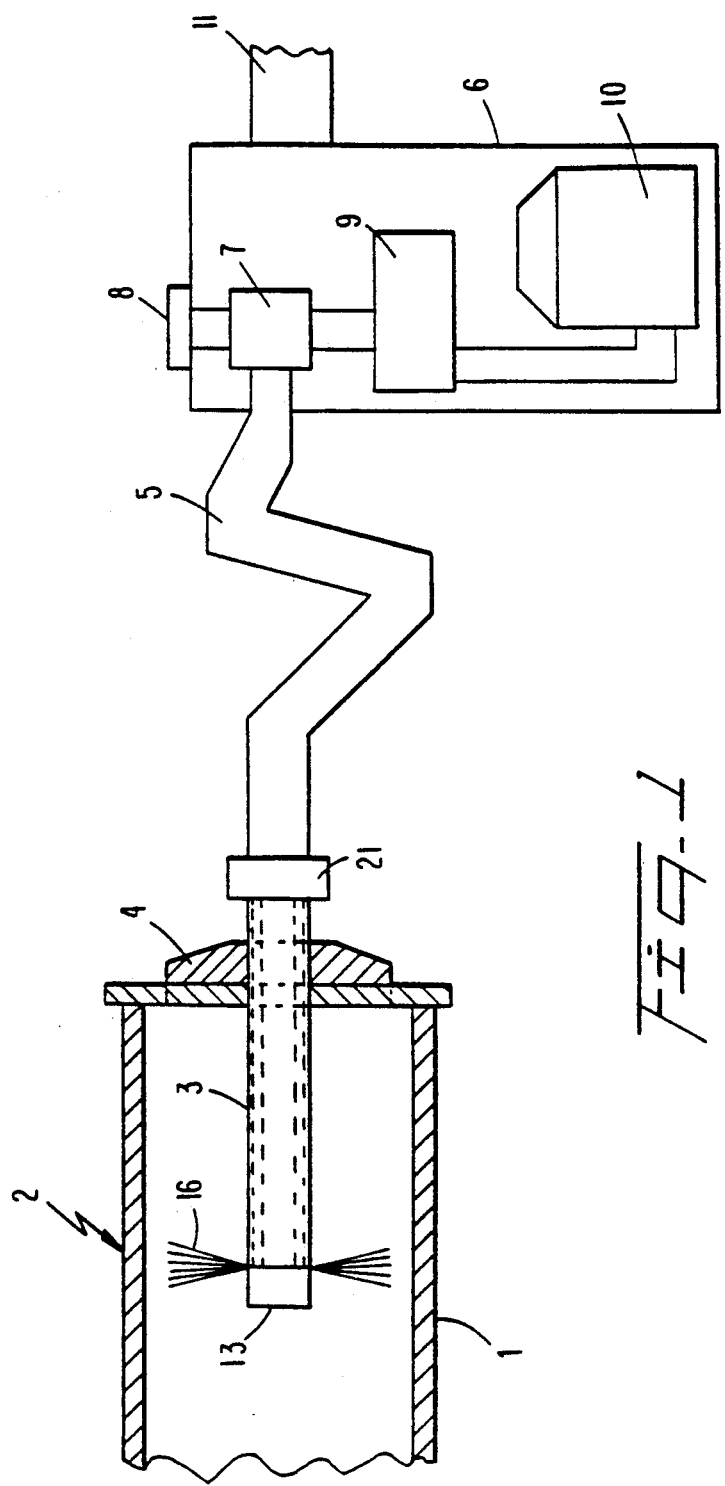
FIG. 1 is a schematic cross-sectional view of the overall apparatus according to one embodiment of the present invention.

The present invention relates to a cleaning system which can be utilized to clean the interior surfaces of a wide variety of chemical reactors and furnaces. In particular, the present invention was designed for cleaning the interior surfaces of chemical vapor deposition reactor furnaces wherein particulates formed during chemical vapor deposition processes are removed by the present invention. However, it is noted that the present invention is not limited for use in connection with chemical vapor deposition reactor furnaces but can be used to clean the interior surfaces of various chemical reactors and other similar vessels and containers. Such reactors and other vessels may have a variety of cross-sectional shapes such as circular, square, rectangular, etc. In order to accommodate reactors of different cross-sectional shapes, the shape of the cleaning head should be complementarily shaped to fit the particular reactor or vessel interior to be cleaned.

The basic components of the present invention, as will be discussed in detail below, include a cleaning head which is insertable into the reactor and means for supplying and removing process fluid to and from the reactor through the cleaning head. The cleaning head includes means to distribute and direct the incoming process fluid to a cleaning zone defined adjacent the cleaning head and further includes exhaust ports for removing process fluid from the interior of the reactor. In operation, the entering process fluid is directed to a portion of the interior surface of the reactor located within the defined cleaning zone and dislodges and removes particulate matter from the interior surface. The dislodged particulate matter becomes entrained in the process fluid and is removed together with the process fluid through exhaust ports located in the cleaning head.

To assist the removal of the particulate matter by the flowing process fluid the cleaning head may be equipped with additional mechanical dislodging means, such as an ultrasonic or piezoelectric vibrator, which aids in dislodging the particulate matter from the interior surfaces of the reactor. In a further embodiment the incoming process fluid may be thermally cycled so as to effect a thermal shock to the particulate matter thereby aiding in dislodging the particulate matter.

In order to adapt the present invention to be utilized in conjunction with heated reactors the incoming process fluid is heated so as to control and avoid excessive thermal shock within the reactor. While thermal shock may be used to dislodge particulate matter, excessive thermal shock may damage the reactor structure. The heating of the incoming process fluid is accomplished by providing both rigid and flexible heat exchanger hose assemblies having an outer process fluid supply hose and one or more inner process fluid removal hoses which are located within the outer process fluid supply hose. In this arrangement, heat is transferred from the process fluid removed from the reactor and is transferred to the process fluid entering the reactor. In a preferred embodiment, as discussed in detail below, the process fluid removal hoses are spirally positioned within the process fluid supply hose to cause turbulent flow of the process fluid and thereby effect a greater heat exchange rate and contribute to the turbulence of the fluid as it is distributed from the cleaning head to thereby aid in dislodging particulate matter from the interior surface of the reactor.

The afore-mentioned heat exchanger hose assembly is flexible. In contrast, the air shaft which connects between the flexible heat exchanger hose assembly and the cleaning head is made of rigid tubular assemblies comprising an outer process fluid supply tube and an inner process fluid removal tube. Being rigid, the air shaft may be supported in a suitable guide means for directing the cleaning head into the reactor. This support means, in a preferred embodiment is further designed to fit over an opening in the reactor in a sealingly tight fit, whereby the overall system can be operated under a negative pressure to insure that all contaminants or particulates are confined and removed by the cleaning system.

The particulate matter entrained in the process fluid is removed from the removed process fluid by a suitable separation means which, in a preferred embodiment, includes a liquid filter through which the processed fluids, i.e., gases are bubbled. The removed process fluid after passing through the filtration means may be released into the environment thereafter or recycled back into the system. In a preferred embodiment the process fluid may include either ambient atmosphere or an inert gas such as nitrogen gas. In further embodiments, the process fluid may be liquid fluid and the filtration means may be any suitable means for removing solid particulates or contaminates from the liquid process fluid.

FIG. 1 illustrates one embodiment of the present invention. In FIG. 1 cleaner head 2 is shown inserted into reactor 1. Cleaner head 2 is supported by air shaft 3 which passes through and is guided by cover 4 which serves as an air lock for sealing reactor 1 so that the cleaning operation may be operated under an overall negative pressure. Air shaft 3 is connected to heat exchanger hose assembly 5 which comprises flexible hoses for supplying and removing process fluid to and from the interior of the reactor 1. Heat exchanger hose assembly 5 is connected to a process fluid control section 6 which includes valve 7 which admits process fluid through port 8 into a process fluid supply hose located in heat exchanger hose assembly 5. The process fluid removed from reactor 1 is directed by means of valve 7 through filter means 9. In operation, the overall system is maintained under a negative pressure by vacuum generator 10 located within the fluid control section 6. Spent process fluid, after having entrained particulates removed therefrom is exhausted through exhaust port 11.

Figure 2:
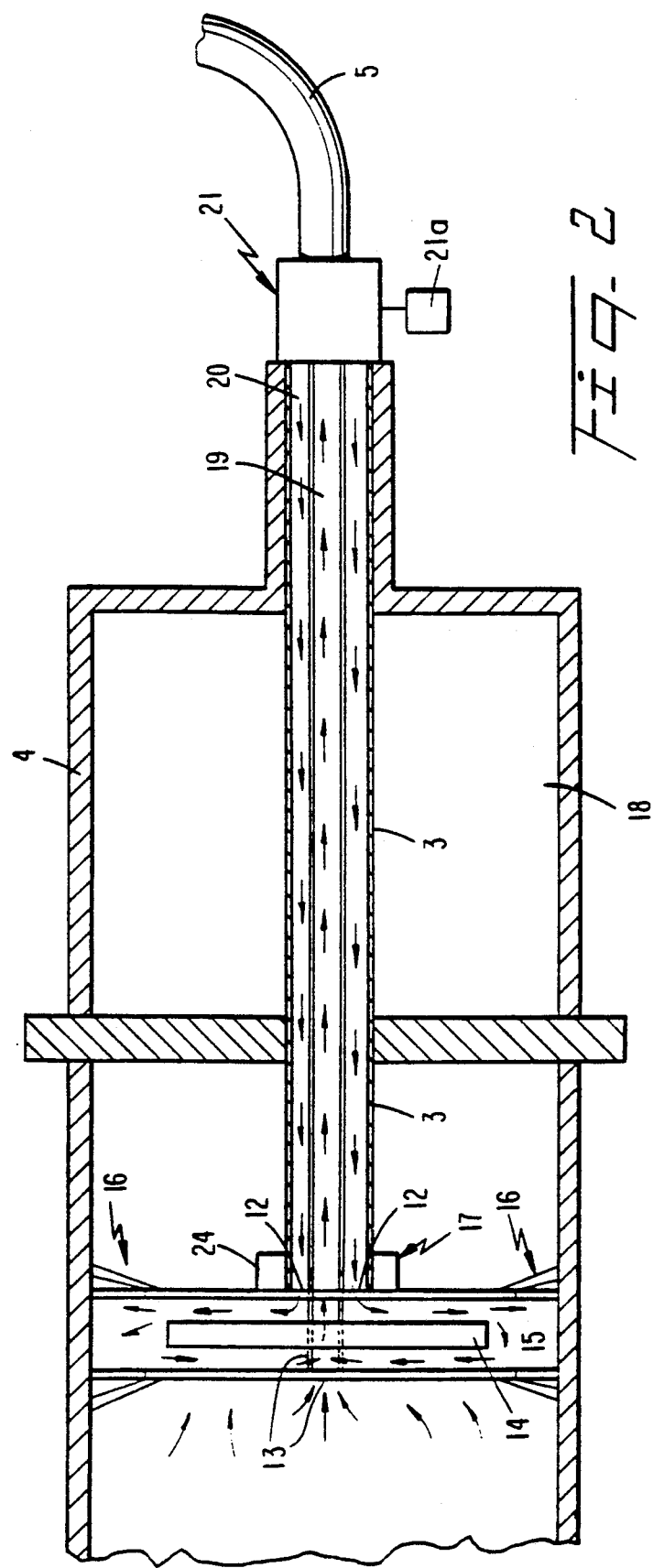
FIG. 2 is a partially schematic cross-sectional view of the cleaning head, air shaft and heat exchanger hose assembly according to one embodiment of the present invention.

FIG. 2 is a partially schematic cross-sectional view of one embodiment of the apparatus according to the present invention which illustrates more specific features of the apparatus. As seen in FIG. 2, cleaning head 2 includes inlet ports 12 through which entering process fluids enter the interior of the reactor and exhaust ports 13 through which process fluids are removed from the interior of the reactor. The entering process fluids pass through inlet ports 12 and are directed to the peripheral surfaces of the cleaning head by means of a fluid distributor 14. The fluids flow radially outward from the center of the fluid cleaning head towards the adjacent interior surfaces of the reactor and radially inward to the exhaust ports. The highly turbulent fluid contacts a small area of the interior surface of the reactor which defines the cleaning zone 15.

To aid in dislodging particulate matter from the interior surface of the reactor, the peripheral portions of the cleaning head are equipped with brush elements 16 as illustrated in FIG. 2. In a preferred embodiment, illustrated in FIG. 2, several brush elements are arranged on either side of the cleaning head to define cleaning zone 15 therebetween. The brush elements 16 and fluid distributor 14 are preferably made of materials which will not contaminate the surface being cleaned. Suitable materials from which to make the brush elements and flow distributor include inert materials, materials virtually identical with the substrate material of the surface being cleaned, e.g., the brush elements may be made from silica fibers when cleaning a silica reactor tube, and materials physically incapable of prolonged contact with the substrate material of the surface being cleaned under conditions of normal operation of the device being cleaned, e.g., the materials may be polyamide when cleaning a silica reactor tube, so that any material remaining within the tube after cleaning are abated by or chemically decomposed upon contact with the tube substrate at operational temperatures.

As a further aid for dislodging particulate matter from the interior surfaces of the reactor cleaning head is equipped with a means 24 for effecting mechanical action on the cleaning head which may be located within the interior of the fluid distributor in a more preferred embodiment. Such mechanical means may include an ultrasonic vibrator or a piezoelectric vibrator whose vibration is transferred from the cleaning head via the brush elements to the interior surface of the reactor so as to aid in dislodging particulate matter from the interior surfaces of the reactor. The cleaning head as illustrated should be suitably sized for the particular reactor so that there is an appropriate area between the peripheral surfaces of the cleaning head and the interior surfaces of the reactor. As illustrated, the brush elements may be positioned to extend between the cleaning and contact the interior surface of the reactor so that they can be used to apply mechanical force to the particulate matter on the interior surfaces. In addition to removing particulate matter from the interior surfaces of the reactor, the exhausted process fluid also removes particulates and other contaminants that are freely suspended within the reactor interior.

Cleaning head is attached as illustrated to air shaft 3 which may be supported and guided by means of cover or air lock 4 or other suitable means. This cover serves as an air lock in that it is sealingly attached to the reactor so that the reactor and the entire system can be maintained under a negative pressure during operation so as to ensure containment of all particulate matter within the reactor. In this regard, it is recognized that in certain reactors, particularly chemical vapor deposition and nuclear reactors, exposure to particulates built up within the reactor can cause serious health problems to workers exposed to these particulates. As illustrated in FIG. 2 the cover or air lock may optionally include a containment zone 18 of a suitable volume for containing cleaning head before and after it is positioned within the reactor.

The air shaft, as illustrated in the cross-sectional view, includes two or more rigid collinear tubular members 19 and 20. The annular space between the tubular members defines an annular passageway in which process fluid may be supplied to the cleaning head. The interior tubular member 19 defines a conduit through which the contaminated process fluid or the process fluid having the dislodged particulates entrained therein is removed from the cleaning head. The annular passageway is connected to the process fluid inlet port of the cleaning head and the process fluid removal conduit is connected to the exhaust ports in the cleaning head.

The air shaft as illustrated in FIG. 2 is connected to the heat exchanger hose assembly by an optional filter and heating unit 21 located along or between the air shaft 3 and heat exchanger hose assembly 5 as illustrated in FIG. 2. This optional filter and heating unit is utilized to properly condition the process fluid as it enters the air shaft and subsequently enters the interior of the reactor. In start up operations the heater unit may be operated by a suitable control means 21a to heat incoming process fluid, until removed process fluid is at a temperature comparable to that experienced during the subsequent process cycle. The heater may also be utilized to thermally cycle incoming process fluid in order to assist in dislodging particulates as discussed above. The filter unit is particularly utilized for removing entrained contaminant particulates from the process fluid prior to its entry into the vessel. To provide information required to effectively control and operate the invention, various sensor devices may be located and used in appropriate locations throughout the system. For illustrative purposes, one set of such sensors, e.g. thermocouple and photoelectric particle detector, element 17 is located adjacent the cleaning head as illustrated as in FIG. 2.

Figure 3:
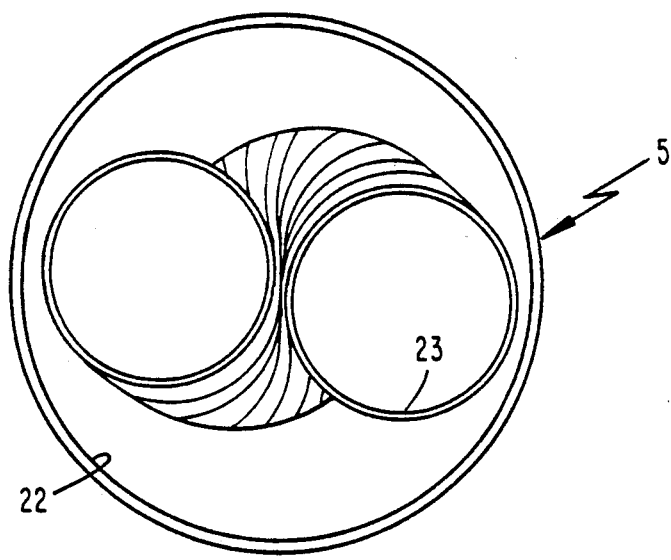
FIG. 3 is a cross-sectional view of a portion of the heat exchanger hose assembly which illustrates one embodiment of the process fluid supply and removal hoses.

FIG. 3 illustrates a cross-sectional view of the heat exchanger hose assembly. As illustrated in FIG. 3 the heat exchanger hose assembly 5 includes an outer process fluid supply hose 22 and one or more inner process fluid removal hoses 23. In a preferred embodiment as illustrated in FIG. 3, two inner process fluid removal hoses are positioned in the outer process fluid supply hose in a spiralling arrangement. This preferred spiralling arrangement in the process fluid removal hoses increases the turbulent action of the process fluid as it is supplied to and removed from the heat exchanger hose assembly, thus aiding the heat transfer between the exiting heated process fluid and the entering cooler process fluid. The heat exchanger hose assembly is made flexible so as to be easily manipulated as the cleaning head is passed in and out of the reactor.

Figure 4:
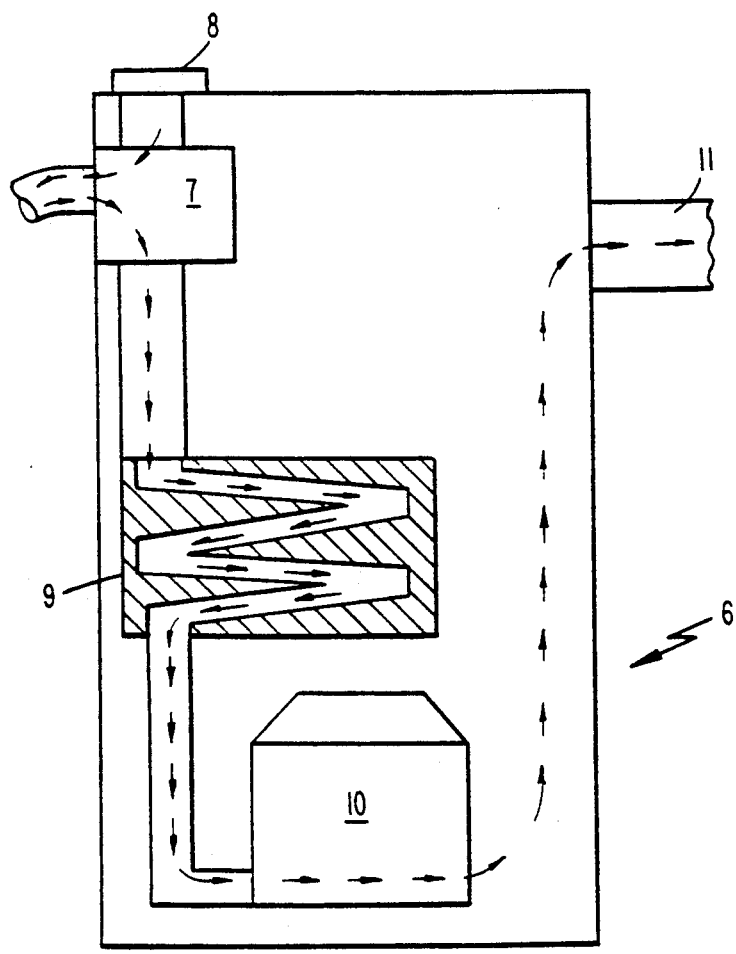
FIG. 4 is a partially schematic cross-sectional view of the process fluid control section used in conjunction with the cleaning system of the present invention.

FIG. 4 schematically illustrates the elements of the fluid control section 6. As illustrated in FIG. 4 the heat exchanger hose assembly connects to valve 7 which directs process fluid into and out of the appropriate hoses of the heat exchanger hose assembly. The process fluid, which may comprise ambient air is fed through entry port 8 and valve 7 into the heat exchanger hose assembly. Exiting process fluid is received from the heat exchanger hose assembly, is passed through valve 7 and is directed into a filtration means 9. This filtration means may comprise any suitable filtration means for removing the particulate material from the process fluid. Depending on the nature of the process fluid, i.e., liquid or gas, any suitable filtration means may be selected, e.g. physical, chemical, etc. In a preferred embodiment particulate materials from a chemical vapor deposition reactor were filtered by bubbling the exhausted process gas through a cooled liquid. Clean or purified removed process fluid is passed from the filtering system through an exhaust port 11 which may release the fluid into the ambient atmosphere or direct the fluid to other fluid handling or containment means.

As illustrated in FIG. 4 the system is connected to a vacuum generator 10 which maintains an overall negative pressure throughout the entire system during operation. By operating under a vacuum all particulates are necessarily collected, contained and processed through the cleaning system.

In operation, the cleaning system is attached to an opening in the reactor such as an access opening by means of the air lock or cover which provides for a virtually fluid tight seal between the cleaning system and the reactor. Once attached to the reactor, the cleaning head is passed into and through the interior of the reactor so that the brush elements contact the inner surfaces of the reactor. The cleaning head is guided as it passes through the reactor by means of the air lock or cover which includes sufficient structure to support the air shaft and thereby guide the movement of the cleaning head. Alternatively, the cleaning head may be guided by suitable rollers or cantilever assemblies connected to the cleaning head.

As the cleaning head is passed through the reactor the fluid control section is activated so that the vacuum generator creates an overall negative pressure throughout both the reactor and the cleaning system. As a result of this negative pressure processing fluids, such as ambient atmosphere enters entry port 8 of the fluid control section and are passed by means of valve 7 through the heat exchanger hose assembly, the optional heating element, the prechamber filter unit, and the air shaft to be distributed by means of the cleaning head against the interior surfaces of the reactor.

As the cleaning head is passed into and through the reactor, the cleaning head may be subject to any desired combination of linear, vibrational and rotational motion. The vibrational motion is provided by the mechanical means 24 described above. The linear and rotational motion may be provided either manually or by a suitable mechanical means as the connected air shaft 3 is guided though cover or air lock 4.

After contacting the interior surfaces of the reactor and dislodging, entraining and removing particulate matter from the interior surface of the reactor, the processing fluid becomes heated due to the temperature of the reactor and is removed through the exhaust port in the cleaning head and passes through the air shaft and enters the heat exchanger hose assembly. As the heated process fluid is removed through the heat exchanger hose assembly heat is exchanged between the removed process fluid and transferred into the entering or supplied process fluid. Additional heat, as required, and particularly upon start up operation is added by means of the filtering and heating unit. As the exhausted or removed processing fluid enters the fluid control section processing fluid entrained with removed particulates is directed by means of valve 7 to filtering means 9 wherein the particulate material is removed from the processing fluid.

In a preferred embodiment the particulates are removed as a result of bubbling the process fluid through a cooled liquid. These removed particulates may be retained for later analysis and monitoring of the particular reaction occurring in the reactor unit. The purified processing fluid, having the particulates removed therefrom, is exhausted through exhaust port 11.

In an alternative embodiment of the present invention as illustrated in FIG. 5, incoming process fluid may be introduced into the system at one or more locations between the air shaft and the heat exchanger hose assembly in lieu of the process fluid entry port 8. In this manner, thermal or flow velocity characteristics of the process may be changed so as to control the surface temperature of the heat exchanger hose assembly.

As illustrated in FIG. 5, valve 7 and process fluid entry port 8 are removed from the fluid control section 6 and a valve assembly 7' of known type, which includes a process fluid entry port 8', is positioned between air shaft 3 and heat exchanger hose assembly 5. In the embodiment of FIG. 5 valve 7 has further been replaced with a coupling connector 25 which connects the outer process fluid supply hose and the inner process fluid removal hoses to single fluid conduit 26.

In operation of the embodiment of the invention illustrated in FIG. 5 processing fluid, e.g., ambient atmosphere, enters process fluid entry port 8' and is distributed by valve assembly 7' in three portions. A minor portion, e.g., 5-15 vol. % of the entering process fluid is directed by valve assembly 7' to flow down the outer process fluid supply hose 22 to combine with the balance of the process fluid at coupling connector 25. A second, major portion, e.g., 70-90 vol. % of the entering process fluid is directed by valve assembly 7' to flow through the exterior tubular member 20 of air shaft 3 into the cleaning zone and then through the interior tubular member 19 of air shaft 3 to valve assembly 7'. A further, minor portion, e.g., 5-15 vol. % of the entering process fluid enters process fluid entry port 8' and is combined by the valve assembly with the major portion of the process fluid flowing down the outer process fluid supply hose 22. The combined major and minor portion of the process fluid flows from the valve assembly 7' through the inner process fluid hoses 23 to combine with the balance of the process fluid at coupling connector 25. Thereafter, the process fluid is filtered in the fluid control section as described above.

As described above, in the embodiment of the invention illustrated in FIG. 5, all of the process fluid enters process fluid entry port 8'. Therefore, as described, the process fluid flows in one direction, towards the process fluid control section 6, in heat exchanger hose assembly. The advantage provided by the embodiment of the invention illustrated in FIG. 5 is that surface temperature of the heat exchanger hose assembly can be lowered and controlled by combining hot and ambient process fluid within the heat exchanger hose assembly.

The cleaning system of the present invention provides for a convenient, efficient and economical manner of cleaning the interior surfaces of a reactor or similar vessel. As applied to chemical vapor deposition processes, the present invention could be used to clean chemical vapor deposition reactor furnaces in a very short time period without the need of highly trained technical operators. The present invention can increase furnace availability, free technicians to perform other critical duties and increase process control, product yield and device reliability.

While the cleaning system of the present invention has been described in the particular context for cleaning the interior surfaces of vessels, there are more particular features and further embodiments which are applicable to several diverse applications. For example, the above description describes the use of a set of sensors for monitoring and controlling the cleaning operation which includes a thermocouple and a photoelectric particle detector. It is sufficient to note that, depending upon the particular application, the number and types of sensors, e.g., thermocouples, thermometers, spectrum analyzers and the like; gas component analyzers; fluid pressure and flow sensors, e.g., manometers, pilot tubes, anemometers, mass flow sensors, bourdon tube gages, differential pressure gauges, flow meters, diaphragm gauges and the like; particulate sensors, e.g., photoelectric analyzers, impact analyzers, mass analyzers, doppler shift analyzers, ultrasonic analyzers, conductivity analyzers, electric field analyzers and the like; clearance sensors (to measure the gap between the brush elements and the surface to be treated), e.g., frequency analyzers, transducers, reflectance meters, resonance analyzers, electromagnetic field analyzers, fiber strain analyzers, differential pressure analyzers and the like; and heat flow sensors, e.g., differential pyrometers, power use analyzers, strain sensors, chronometric analyzers and the like may be appropriately selected for the particular parameters, properties or components to be mounted for control purposes.

The positioning of the various sensor devices is dependent on the parameter property or components to be monitored and controlled. For example a thermocouple and/or anemometer may be located in the process fluid intake chamber. Other thermocouples may be located in the heating and final filter unit entrance and exit. Another thermocouple and photoelectric particle detector may be located at the entrance to the exhaust section on the rigid heat exchanger. Another thermocouple may be located at the entrance to the bubble filtration tank. A differential manometer may be located across the entrance and exit ports for the process fluid lines. Each of these sensor locations and means would provide for the particular sensing and control of specific portions of the cleaning system.

It has been discovered that minor modifications to the cleaning head assembly and airlock enable the airlock unit to complete the boundaries enclosing the cleaning zone which are not provided by the surface being cleaned. With such modification, irregular and/or unbounded surfaces can be cleaned by the present invention. For example, the area between cooling fins on a heat exchanger within a nuclear reactor can easily be cleaned by a simple modification of the cleaning head. Similarly, the floor of an emergency room of a hospital can be effectively cleaned and sterilized by a cleaning head modified to provide a bounded treating surface.

While the system of the present invention is primarily designed for cleaning surfaces, suitable processing fluids can be used to chemically treat, sterilize, alter and coat desired surfaces. The addition of ultraviolet and/or infrared and/or microwave and/or x-ray and/or nuclear radiation sources to the surface to be treated will provide an environment lethal to lifeforms, enabling the surface to be safely cleaned without exposure of the operator to harmful sterilizing agents or the lifeforms being exterminated. Exposure to nuclear ionizing or transmuting radiation would be applicable to decompose surfaces such as cross-linked polymers.

Control and magnification of the amplitude of the thermal, ultrasonic, and piezoelectric stress induction mechanics will enable disruption and removal of surface material immediately adjacent to the treatment or cleaning zone from identical substrate material out of the range of effective disruption, resulting in additional application of the invention as a mining, boring and/or tunneling tool and as a surface remover.

Appropriate application of stress induction techniques effective upon the surface layer but less effective upon an adjacent non-identical substrate will allow the device to dislodge and remove such surface layers without damage to the underlying substrate. For example, appropriate selection of ultrasonic frequencies would allow removal of ice from sidewalks without melting or scraping. Likewise, appropriate selection of ultrasonic, electromagnetic radiation frequencies and process fluids would dislodge and decompose asbestos fibers and binder materials from surfaces in a safe and effective manner.

Thus the system of the present invention has usefulness for altering the topology, chemical identity, or physical properties of surfaces.

Although the invention has been described with reference to particular means, materials and embodiments, from the foregoing description, one skilled in the art can ascertain the essential characteristics of the present invention and various changes and modifications may be made to adapt the various uses and characteristics thereof without departing from the spirit and scope of the present invention as described in the claims that follow.

I claim:
1. A method of cleaning the interior surfaces of a vessel which comprises:
   providing a cleaning head having at least two spaced apart brush elements which are substantially perpendicular to an interior surface of a vessel;
   positioning said cleaning head in said vessel;
   defining a cleaning zone between said at least two spaced apart brush elements and between said interior surface of said vessel;
   dislodging particulates from the interior surface of said vessel; and
   removing said dislodged particulates,
   said dislodging being accomplished by supplying a heated turbulent process fluid into said defined cleaning zone in said vessel and by further subjecting said particulates to a process selected from the group consisting of mechanical agitation, thermal stress, physical interaction with said process fluid, chemical interaction with said process fluid and combinations thereof.

2. A method of cleaning the interior surfaces of a vessel according to claim 1, wherein said dislodged particles are removed from said vessel by entraining dislodged particulates into said supplied process fluid and exhausting said supplied process fluid along with said dislodged particulates.

3. A method of cleaning the interior surfaces of a vessel according to claim 2, wherein said process fluid is both supplied to and removed from said vessel and thermal energy is exchanged between said process fluid that is removed from said vessel and said process fluid that is supplied to said vessel so as to equalize the temperature of said process fluid supplied to said vessel with that removed from said vessel.

4. A method of cleaning the interior surfaces of a vessel according to claim 1, wherein said removed particulates are collected after being removed from said vessel.

5. A method of cleaning the interior surfaces of a vessel according to claim 1, wherein said interior of said vessel is subjected to a negatived pressure during said cleaning.

6. A method for cleaning the interior surfaces of a vessel according to claim 1, wherein said vessel comprises a reactor.

7. A method for cleaning the interior surfaces of a vessel according to claim 1, wherein said reactor comprises a chemical vapor deposition reactor.

8. A method for cleaning the interior surfaces of a vessel according to claim 1, wherein said process fluid is selected from the group consisting of inert gases and ambient atmosphere.

9. A method of cleaning the interior surfaces of a vessel according to claim 1, wherein said mechanical agitation consists of ultrasonic vibration or piezoelectric vibration.

* * * * *